United States Patent
Krause et al.

(10) Patent No.: US 8,735,212 B2
(45) Date of Patent: May 27, 2014

(54) SILICON SOLAR CELL MANUFACTURE

(75) Inventors: Rainer Klaus Krause, Kostheim (DE); Gerd Pfeiffer, Poughquang, NY (US); Hans-Juergen Eickelmann, Nieder-Hilbersheim (DE); Thorsten Muehge, Budenheim (DE)

(73) Assignee: International Business Machines Corporation, Armonk, NY (US)

( * ) Notice: Subject to any disclaimer, the term of this patent is extended or adjusted under 35 U.S.C. 154(b) by 827 days.

(21) Appl. No.: 12/866,737

(22) PCT Filed: Jan. 13, 2009

(86) PCT No.: PCT/EP2009/050298
§ 371 (c)(1),
(2), (4) Date: Nov. 29, 2010

(87) PCT Pub. No.: WO2009/098105
PCT Pub. Date: Aug. 13, 2009

(65) Prior Publication Data
US 2011/0100451 A1 May 5, 2011

(30) Foreign Application Priority Data
Feb. 7, 2008 (EP) .................................... 08151169

(51) Int. Cl.
*H01L 31/0224* (2006.01)
(52) U.S. Cl.
USPC .................. 438/96; 438/66; 438/68; 438/73; 438/80; 438/98; 136/252; 136/255; 136/256; 136/258

(58) Field of Classification Search
USPC ............ 136/243–252; 438/66, 68, 73, 80, 96, 438/98
See application file for complete search history.

(56) References Cited

U.S. PATENT DOCUMENTS 5,100,808 A 3/1992 Glenn
(Continued)

FOREIGN PATENT DOCUMENTS

EP 0509615 A2 10/1992
JP 53-074891 A 7/1978
(Continued)

OTHER PUBLICATIONS

International Search Report and Written Opinion in PCT patent application PCT/EP2009/050298 of which the present patent application is a national stage patent application, dated May 28, 2009.

*Primary Examiner* — Matthew Martin
(74) *Attorney, Agent, or Firm* — Steven Bennett

(57) ABSTRACT

A silicon solar cell is manufactured by providing a carrier plate, and by applying a first contact pattern to the carrier plate. The first contact pattern includes a set of first laminar contacts. The silicon solar cell is further manufactured by applying a multitude of silicon slices to the first contact pattern, and by applying a second contact pattern to the multitude of silicon slices. Each first laminar contact of the set of first laminar contacts is in spatial laminar contact with maximally two silicon slices. The second contact pattern includes a set of second laminar contacts. Each second laminar contact of the set of second laminar contacts is in spatial laminar contact with maximally two silicon slices.

13 Claims, 4 Drawing Sheets

(56) References Cited

U.S. PATENT DOCUMENTS

| | | | |
|---|---|---|---|
| 5,131,954 A * | 7/1992 | Vogeli et al. | 136/244 |
| 6,423,567 B1 * | 7/2002 | Ludemann et al. | 438/83 |
| 2005/0139252 A1 * | 6/2005 | Shim | 136/244 |
| 2008/0078444 A1 * | 4/2008 | Atanackovic | 136/256 |
| 2009/0107545 A1 * | 4/2009 | Moslehi | 136/256 |

FOREIGN PATENT DOCUMENTS

| | | |
|---|---|---|
| JP | 10-041531 A | 2/1998 |
| JP | 2006-341547 A | 12/2006 |
| WO | 89/05521 A1 | 6/1989 |
| WO | 92/07386 | 4/1992 |
| WO | 92/07386 A1 | 4/1992 |

* cited by examiner

SILICON SOLAR CELL MANUFACTURE

RELATED APPLICATIONS

The present patent application is a national stage application of the previously filed PCT patent application having the PCT application number PCT/EP2009/050298, filed on Jan. 13, 2009, and which claims priority to the previously filed EP patent application having the EP patent application number 08151169.3, filed on Feb. 7, 2008.

BACKGROUND

Solar cells are devices that convert light energy into electrical energy by the photovoltaic effect. There is currently a high demand for solar cells, because solar cells have many applications. For example, solar cells are used for powering small devices like calculators. Furthermore, solar cells are increasingly being used in vehicles and satellites. Solar cells also have the potential of becoming state-of-the-art power plants, since solar cell technology is a technology branch favored by society. Society favors solar cell technology because the electricity produced by solar cells is renewable 'clean' electricity.

Solar cells include a semiconductor material that is used to absorb photons and generate electrons via the photovoltaic effect. One semiconductor material typically used for manufacturing solar cells is silicon. In solar cells, silicon can be used either as mono or polycrystalline silicon.

State-of-the-art silicon solar cells typically include a set of individual silicon plates, each with a size about 15×15 centimeters (cm). Such state-of-the-art solar cells have various disadvantages, however. Due to the large size of the individual silicon plates, the backside of these individual silicon plates are electrically connected using bus bars. The application of the bus bars to the silicon plates is performed by high-temperature diffusion processes, which consume large amounts of energy. High-energy usage during the manufacture of solar cells reduces the cost effectiveness of the solar cells. Furthermore, since bus bars are non-laminar backside contacts, the electrical contacting of the backside of solar cells is not optimal.

The typically large size of the individual plates results in another disadvantage: solar cells are usually connected in series in modules, creating an additive voltage. The reason for connecting solar cells—i.e. individual plates—in series is to minimize electrical resistance losses resulting from the transport of electricity through electrical lines. However, assuming a given limited total area of a solar cell panel having a set of individual plates, just a limited number of individual plates can be used within the solar cell panel, due to the large size of the individual plates. Furthermore, to reach high operation voltages many individual plates have to be connected in series. For example, a typical individual solar cell plate only delivers a voltage of 0.6 volts (V). To obtain a typical operation voltage of a solar cell panel of 66 V, about 100 individual silicon plates have to be connected in series, which requires—in the case where state-of-the-art sized solar cell plates are used—a large amount of space, which is often not available.

In addition, the individual current delivered from one individual state of the art sized solar cell plate is rather high: assuming again the typical size of a standard silicon plate that is 156×156 millimeters (mm), the total area of such a plate is 243 square cm. A typical plate delivers a power of 3.6 watts (W), which at a conversion efficiency of 15% and a typical output voltage of 0.6 V corresponds to a current of 6 amps (A). However, since individual bus bars are used to connect the backside of the solar cell plates, the bus bars have to be designed in a highly robust manner to withstand such high currents. This also increases the costs of design and manufacturing of solar cells.

SUMMARY OF THE INVENTION

A method of an embodiment of the invention is for manufacturing a silicon solar cell. The method provides a carrier plate, and applies a first contact pattern to the carrier plate. The first contact pattern includes a set of first laminar contacts. The method applies a multitude of silicon slices to the first contact pattern. Each first laminar contact of the set of first laminar contacts is in spatial laminar contact with maximally two silicon slices. The method applies a second contact pattern to the multitude of silicon slices. The second contact pattern includes a set of second laminar contacts. Each second laminar contact of the set of second laminar contacts is in spatial laminar contact with maximally two silicon slices.

A silicon solar cell of an embodiment of the invention includes a carrier plate, and a first contact pattern located on top of the carrier plate and that includes a set of first laminar contacts. The silicon solar cell also includes a multitude of silicon slices located on top of the first contact pattern and a second contact pattern located on top of the multitude of silicon slices. Each first laminar contact of the set of first laminar contacts is in spatial laminar contact with maximally two silicon slices. The second contact pattern includes a set of second laminar contacts. Each second laminar contact of the set of second laminar contacts is in spatial laminar contact with maximally two silicon slices.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1A:
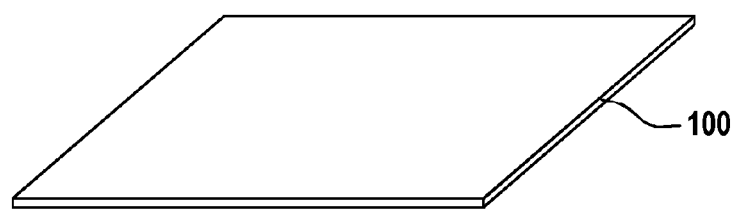
FIGS. 1A, 1B, 1C, and 1D are diagrams illustratively depicting a method for manufacturing a silicon solar cell, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

In accordance with an embodiment of the present invention, there is provided a method of manufacturing a silicon solar cell. The method provides a carrier plate, and applies a first contact pattern to the carrier plate. The first contact pattern includes a set of first laminar contacts. The method applies a multitude of silicon slices to the first contact pattern. Each first laminar contact of the set of first laminar contacts is in spatial laminar contact with maximally two silicon slices. The method applies a second contact pattern to the multitude of silicon slices. The second contact pattern includes a set of second laminar contacts. Each second laminar contact of the set of second laminar contacts is in spatial laminar contact with maximally two silicon slices.

In one embodiment, ultra-thin silicon slices having a typical size of 1 centimeter (cm)×2 cm×50 micrometers (μm) are used to assemble the solar cell. The ultra-thin silicon slices can have a thickness in the range of 10-20 μm. One advantage of the method described above is that a large amount of individual silicon slices can be connected in series with each other in an easy and inexpensive manner. In general, the individual solar cells can be configured to deliver a large range of current/voltage ratios, by adapting the first and second contact pattern with respect to the position of the individual silicon slices. Via the first and second contact patterns, an almost arbitrary mix of serial and parallel interconnections between the individual silicon slices can be provided. As such, a quasi backside contact capability can be provided.

In accordance with an embodiment of the invention, each first laminar contact of the set of first laminar contacts is in spatial contact with exactly two silicon slices and each second laminar contact of the set of second laminar contacts is in spatial laminar contact with exactly two silicon slices. As such, an easy serialization of individual silicon slices is possible. In accordance with another embodiment of the invention, each silicon slice is in spatial laminar contact with exactly one first laminar contact and one second laminar contact. In this configuration, an optimal utilization of individual silicon slices is provided.

In accordance with an embodiment of the invention, the method further includes passivating and/or anti-reflective coating the carrier plate and/or the silicon slices. Such passivation advantageously minimizes a recombination of charge carriers. Furthermore, the anti-reflective coating advantageously maximizes the amount of photons absorbed by the manufactured silicon solar cell, since the number of lost photons due to reflections on surfaces of the manufactured silicon solar cell is minimized.

In accordance with an embodiment of the invention, the method further includes metalizing the silicon slices on the side averted from the carrier plate. The metallization of the silicon slices on the side averted from the carrier plate advantageous increases the probability of photo absorption, since photons that were not absorbed on their first passage through the silicon solar cell are reflected back into the silicon solar cell. In another embodiment of the invention, the method further includes n-doping the silicon slices after application of the silicon slices to the first contact pattern. However, in general, the silicon slices can be doped before applying them to the first contact pattern.

In accordance with an embodiment of the invention, the method further includes adhering the silicon slices to the first laminar contact and/or adhering the silicon slices to the second laminar contact. Adhesion of the silicon slices to the laminar contacts advantageously provides for a silicon solar cell that is extremely stable mechanically, since all components stick together. In accordance with another embodiment of the invention, the adhesion of the silicon slices to the first laminar contacts is performed by applying a first contact glue to the set of first laminar contacts or the silicon slices, where the first contact glue adheres the silicon slices to the first laminar contacts. The adhesion of the silicon slices to the second laminar contacts can be performed by applying a second contact glue to the set of second laminar contacts or the silicon slices, where the second contact glue adheres the silicon slices to the second laminar contacts. For example, the adhesion of the silicon slices to the first laminar contact can be performed by anodic bonding techniques and/or the adhesion of the silicon slices to the second laminar contacts can be performed by anodic bonding techniques.

In accordance with an embodiment of the invention, the first or the second contact pattern can be applied to the carrier plate by printing or by lithography. For example, the printing can be a screen printing process. The printing can be performed using a hard mask. In this case, the printing further includes covering the carrier plate with a first hard mask. The first hard mask includes a pattern of first openings that uncover the carrier plate at areas designated for the first contact pattern. The printing process further includes depositing a masking material through the first hard mask on the carrier plate, removing the first hard mask, depositing the conductive material on the carrier plate, and removing the masking material from the carrier plate. The remaining conductive material constitutes the first contact pattern.

With respect to the second contact pattern, the printing process includes covering the multitude of silicon slices with a second hard mask. The second hard mask includes a pattern of second openings that uncover the multitude of silicon slices at areas designated for the second contact pattern. The printing process deposits a masking material through the second hard mask on the carrier plate. The method further includes removing the second hard mask, depositing the conductive material on the multitude of silicon slices, and removing the masking material from the carrier plate. The remaining conductive material constitutes the second contact pattern.

In accordance with an embodiment of the invention, the hard mask is provided by using soft-stamping techniques. The usage of soft-stamping techniques advantageously provides an easy and quick manner by which a polymer material can be stamped onto a surface, which is further ultraviolet (UV) curved and acts as a mask. The high speed of such a mask production process is of great advantage for mass production purposes.

In accordance with an embodiment of the invention, the method further includes applying a filler material to the silicon slices. The filler material fills the gaps between adjacent silicon slices, and is electrically isolating. The filler material further stabilizes the silicon solar cell arrangement and thus eases the handling of the solar cell during an assembly procedure.

In another embodiment of the invention, a silicon solar cell includes a carrier plate, a first carrier plate, and a first contact pattern. The first contact pattern is located on top of the carrier plate, and includes a set of first laminar contacts. The solar cell further includes a multitude of silicon slices located on top of the first contact pattern, where each first laminar contact of the set of first laminar contacts is in spatial laminar contact with maximally two silicon slices. The silicon solar cell also includes a second contact pattern located on top of the multitude of silicon slices. The second contact pattern includes a set of second laminar contacts, where each second laminar contact of the set of second laminar contacts is in spatial laminar contact with maximally two silicon slices.

In accordance with an embodiment of the invention, the first contact pattern is displaced relative to the second contact pattern by the extension length of a silicon slice in the displacement direction. Such displacement provides an optimal relative arrangement of the first contact pattern, the silicon slices, and the second contact pattern for serial connection of individual slices of the silicon solar cell. The electrical internal connections needed to obtain a serialized solar cell are thus easily provided, which reduces the risk of malfunctions and also eases the production process. This in turn permits inexpensive production of the silicon solar cells.

In accordance with an embodiment of the invention, the first and/or the second contact pattern are transparent to light usable for energy conversion via the silicon slices. For example, the material of the first and/or the second contact patterns can include doped zinc oxide (ZnO) or indium tin oxide (ITO). By using such transparent contact patterns, the first and the second contact patterns can be arranged in such a way that the complete surface of the individual silicon slices are covered without any interruption or gaps with electrical contacts. As such, the power density of the solar cell is maximized. In accordance with another embodiment of the invention, the silicon slices include p-doped silicon. The silicon slices can include a photo-active p/n junction.

Figure 1B:
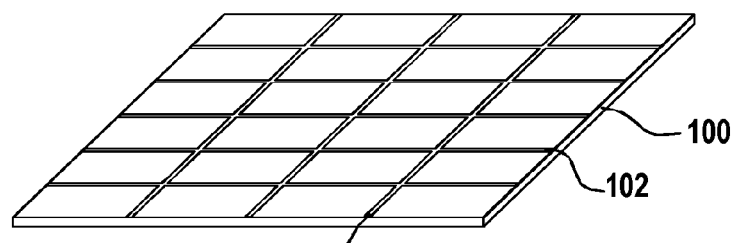

FIGS. 1A-1D illustratively depict a method for manufacturing a silicon solar cell, according to an embodiment of the invention. In a first step, as shown in FIG. 1A, a carrier plate 100 is provided. This is followed by the steps depicted in FIGS. 1B and 1C, which show the application of the first contact pattern to the carrier plate 100. In detail, as shown in FIG. 1B, a mask 102 is applied to the carrier plate 100. As can be seen in FIG. 1B, the mask is a rectangular grid of a polymer material. The polymer masking material can be deposited onto the carrier plate 100 by using a hard mask. The hard mask includes a pattern of first openings, where the first openings cover the carrier plate at areas designated for the first contact pattern. Alternatively, the polymer masking material 102 can be stamped onto the carrier plate 100 by soft-stamping.

Figure 1C:
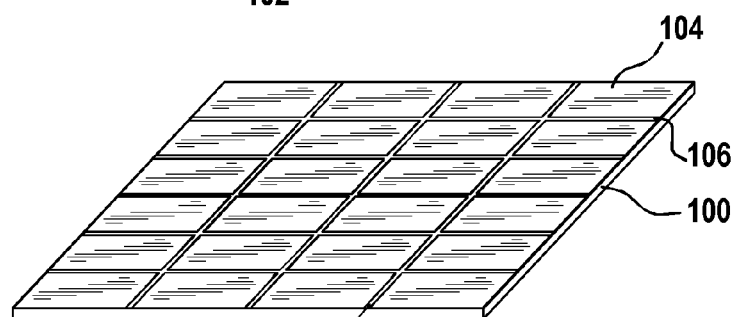

Not shown in FIGS. 1B and 1C is the deposition of the conductive material on the carrier plate. Due to the presence of the masking material 102, the conductive material is deposited on the carrier plate just at areas not covered by the masking material 102. In FIG. 1C, the conductive material deposited onto the carrier plate 100 is depicted by reference numeral 104. The conductive material 104 constitutes the first contact pattern. It is noted that the above-described printing method using a hard mask technique can be replaced by any other standard lithography or printing technology. However, since the method of manufacturing a silicon solar cell is optimized for a highly efficient production process, the usage of hard mask technologies is desirable. Referring still to FIG. 1C, the carrier plate 100 is covered by the first laminar contacts 104, which are electrically and spatially interrupted by the rectangular mask 102. In a further step not shown in FIG. 1C, the masking material 102 is removed. Such a removing process of material is known in the art as a stripping process.

Figure 1D:
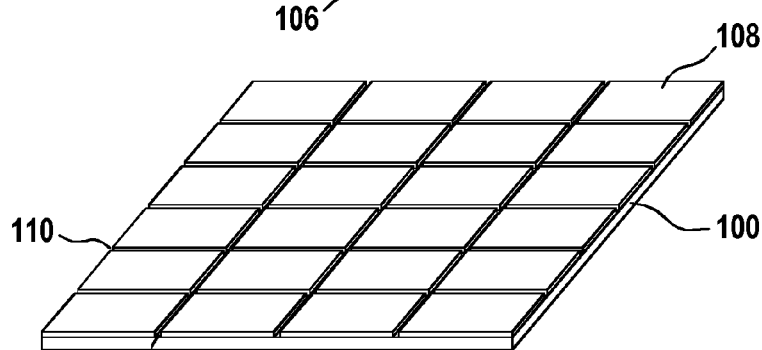

Finally, in FIG. 1D the carrier plate is shown together with attached silicon slices 108, wherein the silicon slices 108 are attached to the first contact pattern 104. The silicon slices 108 can be applied to the first contact pattern 104 by, for example, pick-and-place technology. To finalize the silicon solar cell, a further second contact pattern is applied to the multitude of silicon slices. This can be performed by using the steps that have been explained in reference to FIGS. 1B and 1C. As can be seen in FIG. 1D, between adjacent silicon slices 108, gaps 110 are present.

To enhance the stability of the solar cell, a filler material (not shown) is applied to the silicon slices, where the filler material is filling the gaps 110 between adjacent silicon slices 108. To provide a silicon solar cell with a high voltage output, individual silicon slices are connected in series. This is performed in such a manner to be amenable to mass production of silicon solar cells. A solution of that problem is shown in FIGS. 2A-2C.

Figure 2A:
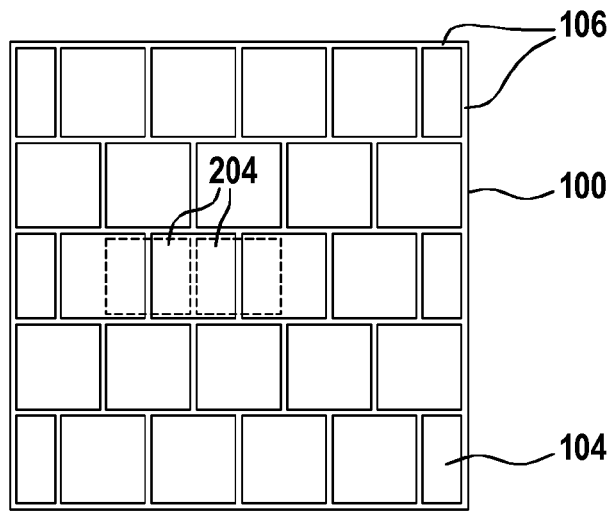
FIGS. 2A, 2B and 2C are diagrams depicting a first and second laminar contact arrangement relative to silicon slices, according to an embodiment of the invention.
Figure 2B:
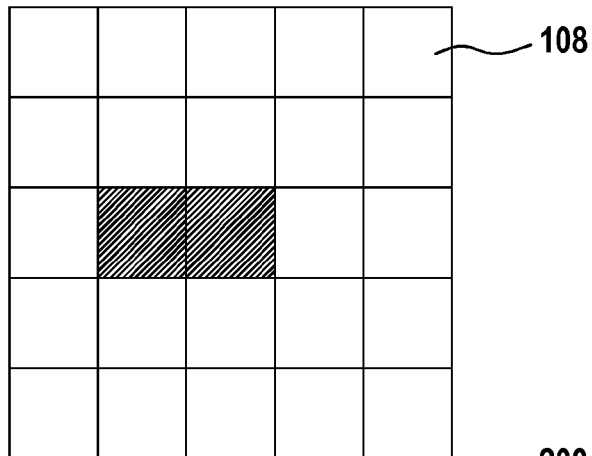
Figure 2C:
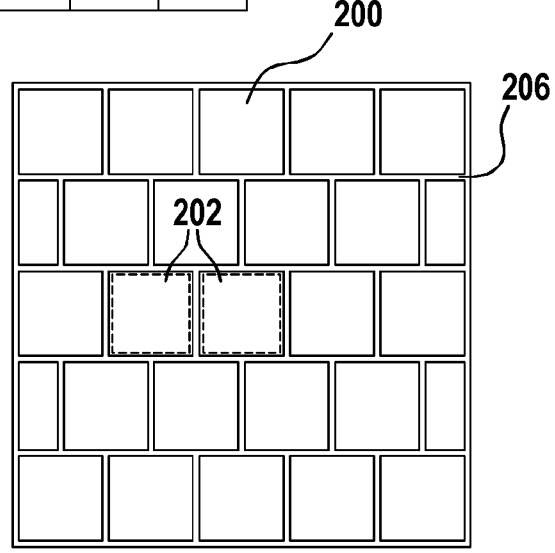

FIGS. 2A-2C illustrate a first and second laminar contact arrangement relative to silicon slices, according to an embodiment of the invention. Shown in FIG. 2A is a top view of a set of first laminar contacts 104, which are separated from one another by gaps. As such, in the top view of FIG. 2A, blank areas 106 of the carrier plate 100 are visible. At these blank areas 106, the first laminar contacts 104 are not covering the carrier plate 100. FIG. 2B shows the multitude of silicon slices 108, which are arranged relative to each other in a rectangular lattice, where the total dimensions of the lattice correspond to the total dimensions of the carrier plate 100.

FIG. 2C depicts tiles 200 forming the second laminar contact. Similar to the first laminar contacts 104, the second laminar contacts 200 are separated by gaps 206. By superpositioning FIG. 2C over FIG. 2A it is evident that the first contact pattern 104 is displaced relative to the second contact pattern 200 by the extension length of a silicon slice 108 in the displacement direction (left to right), which in FIGS. 2A-2C is the horizontal direction. The purpose of this relative arrangement of the first laminar contact 100 to the second laminar contact 200 is evident by considering two individual slices at the positions indicated by the positions 204 in FIG. 2A. By super positioning FIG. 2B, which includes the lattice of individual slices 108, on top of FIG. 2A, it can be seen that position 204 corresponds in FIG. 2B to the slices indicated by the shaded area. By super positioning FIG. 2C onto FIG. 2B, it can be seen that the slices indicated by the shaded area in FIG. 2B correspond to the slice positions 202 in FIG. 2B. As such, via the first laminar contacts 106, the relative positioning of the individual silicon slices 108 on top of the first laminar contacts 104, as well as the relative positioning of the second laminar contacts 200 on top of the individual silicon slices 108, a serial interconnection of the individual silicon slices 108 in horizontal direction is provided.

Figure 3:
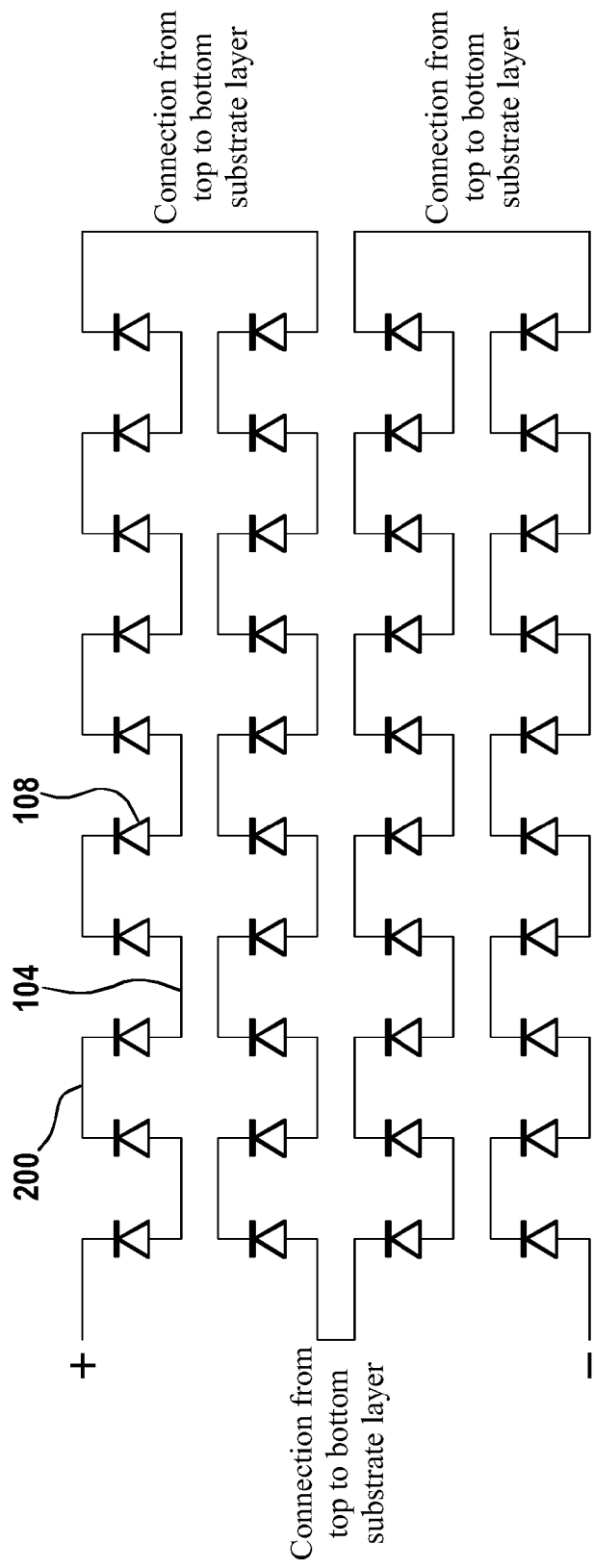
FIG. 3 is a diagram depicting the wiring of a set of silicon slices, according to an embodiment of the invention.

As further clarification, FIG. 3 shows a wiring of a set of silicon slices, according to an embodiment of the invention. As denoted in FIG. 3, the top horizontal lines correspond to the second laminar contacts 200, where the horizontal bottom lines correspond to the first laminar contacts 104. Between the first laminar contacts 104 and the second laminar contacts 200, individual silicon slices 108 are interposed. By alternatingly connecting neighboring silicon slices 108 in the horizontal direction with the first laminar contacts 104 and the second laminar contacts 200, a serial interconnection of individual silicon slices in the horizontal direction is achieved. It is noted that this serialization is achieved by simply applying the first and second laminar contact patterns to the carrier plate. Additional wiring within a horizontal serial line of silicon slices is unnecessary. An additional connection from top to bottom is needed just for a serial interconnection of neighboring vertical serialized silicon slices, such as from the second contact 200 to the first contact 104.

However, if an additional connection from the second laminar contacts 200 to the first laminar contacts 104 is undesired, individual horizontally serially connected silicon slices can be interconnected with respect to neighboring first laminar contacts 104 in the vertical direction and second laminar contacts 200 the in vertical direction. This arrangement yields a further parallelization of the silicon slices in the vertical direction but maintains the serialization of the silicon slices in the horizontal direction. In this way, high power solar cells can be manufactured.

Figure 4:
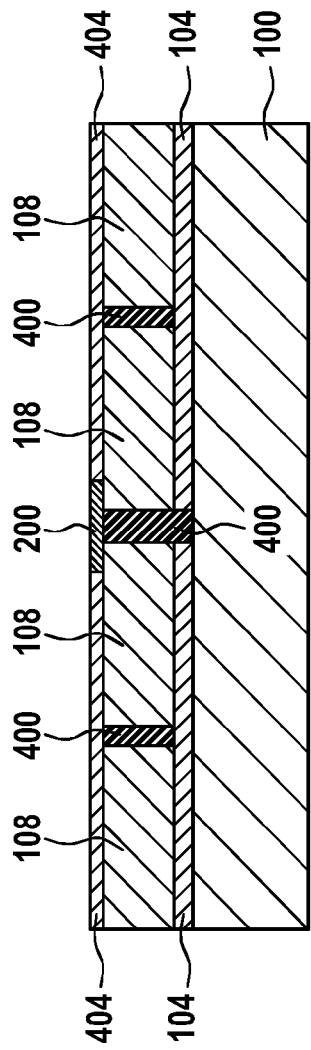
FIG. 4 is a diagram depicting a profile of a solar cell, according to an embodiment of the invention.

FIG. 4 depicts a profile of a solar cell, according to an embodiment of the invention. The bottom of the solar cell includes the carrier plate 100, which is transparent to light incident from the bottom. The next layer on top of the carrier plate 100 is the first laminar contact 104. In the profile of FIG. 4, two first laminar contacts 104 on the left and on the right side are provided, and which are separated by an electrically nonconductive filler material 400. On top of the first laminar contacts 104 are silicon slices 108. Each silicon slice 108 is separated from a neighboring silicon slice 108 by a further electrically nonconductive filler material 400.

Furthermore, the two neighboring silicon slices 108 in the middle of the solar cell depicted in FIG. 4 are interconnected by a second laminar contact 200 such that a serial interconnection of the silicon slices 108 is provided. The circuit diagram of FIG. 3 is reflected within the solar cell profile of FIG. 4. Proceeding in FIG. 4 from left to right, an electric current can flow from the very left silicon slice 108 to the underlying first laminar contact 104, from this contact 104 to the next silicon slice 108, from said silicon slice 108 to the second laminar contact 200, from the second laminar contact 200 to the next right silicon slice 108, from this silicon slice 108 to the underlying first laminar contact 104, and then again to the next right silicon slice 108. Also shown in FIG. 4 is an additional coating 404 which can, for example, be a passivation coating to reduce recombination effects that lower the efficiency of solar cells. The layer 404 may also be or include a highly reflective material such as silver or aluminum, to provide an increased absorption probability in order to reflect back light which is incident to the carrier plate 100 but is not absorbed by the silicon slices 108.

Figure 5:
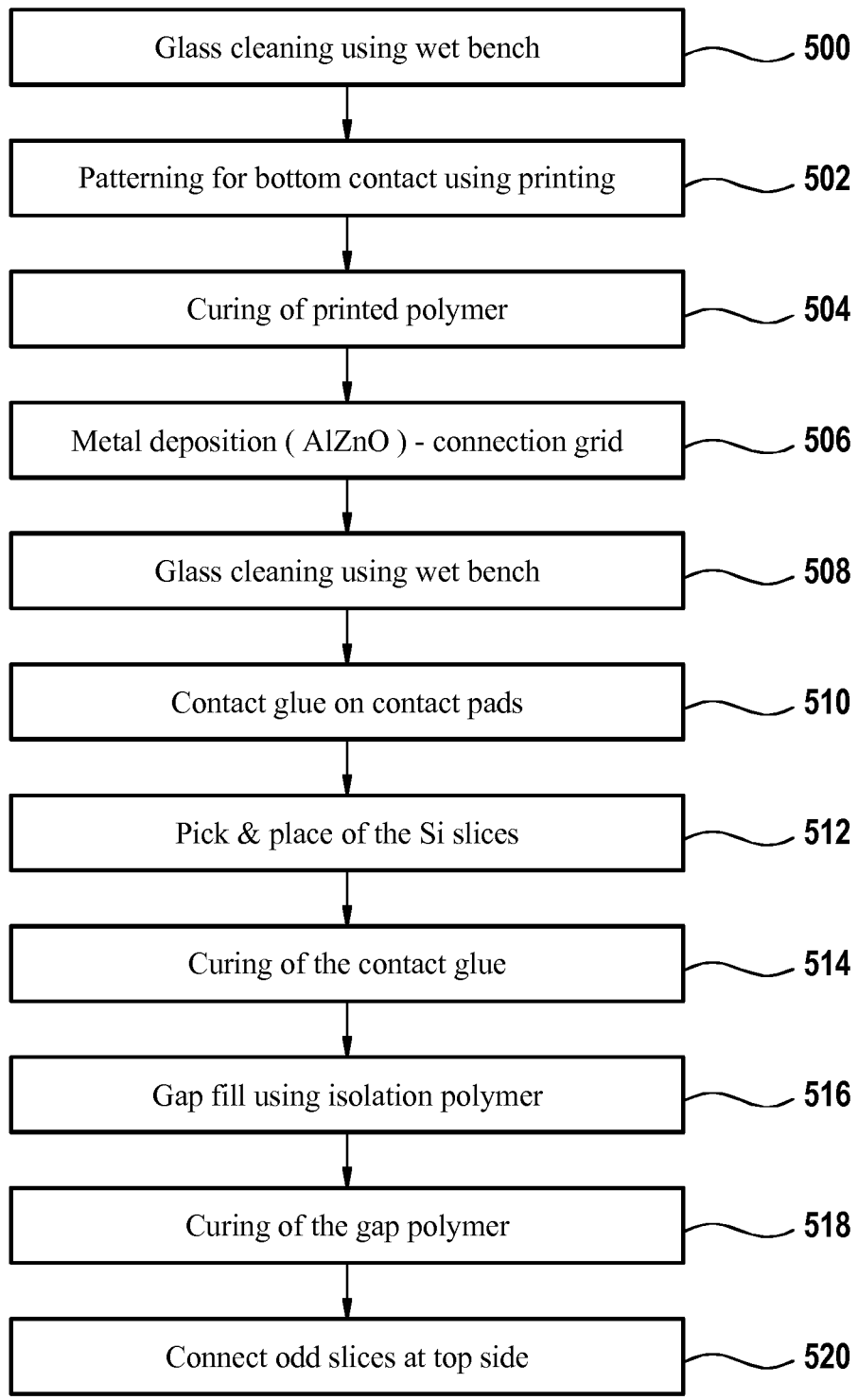
FIG. 5 is a flowchart of a method for manufacturing a silicon solar cell, according to an embodiment of the invention.

FIG. 5 shows a method for manufacturing a silicon solar cell, according to an embodiment of the invention. In step 500, a cleaning of the glass carrier plate is performed using a wet bench. This ensures that high quality solar cells can be manufactured without any embedding of unwanted dust or dirt. Step 500 is followed by step 502, which is a patterning for the bottom contact using, for example, printing or lithography technologies. In one embodiment, in step 502 a polymer is printed onto the carrier plate using a hard mask, which in the subsequent step 504 is cured, such as by thermal or UV curing.

The polymer printed onto the carrier plate covers, as a negative print, the areas which are not to be covered by the first contact pattern. The first contact pattern is deposited onto the carrier plate in step 506. For example, step 506 may be achieved by sputtering a deposition of the first contact pattern material, such as, for example, aluminum zinc oxide (AlZnO). This step is followed by step 508, which is another cleaning step of the carrier plate on which the first contact pattern is now deposited. Not shown in FIG. 5 is the step of stripping—i.e., removing the printed polymer from the carrier plate—since this polymer mask is not needed in further manufacturing steps of the solar cell.

After the cleaning step 508, in step 510 contact glue is deposited on the first contact pattern that was previously deposited in step 506. The deposition of the contact glue onto the contact pattern can, for example, be achieved by employing state-of-the-art printing technologies such as surface mount device (SMD) hard masks. Instead of using a contact glue, anodic bonding can be used to fix silicon slices onto the contact pattern. The silicon slices are placed onto the contact pattern by pick and place technologies in step 512. If a glue was used in step 510, in step 514 the contact glue is cured.

Since in step 506 just certain areas are covered with the first contacts due to the presence of the printed polymer, and since in step 512 the silicon slices are placed on top of these contacts, gaps are present between neighboring placed silicon slices. These gaps are filled in step 516 using an isolation polymer. This polymer is cured in step 518 using, for example, thermal or UV curing. In the last step 520, odd slices are connected at the topside using printing wiring technology. In general, the connection of the odd slices at the topside can be performed using the same steps already described above for the deposition of the first contact pattern, namely the steps 502, 504 and 506.

The technology that has been described above reduces silicon material usage for solar technology by up to 90%, which represents a tremendous cost reduction in the manufacture of silicon solar cells. The described production process further provides for high assembly automation. Backside contacts are secured by an easy connection technology. The cell can be configured simply for any arbitrary voltage/current ratio, starting from typically 0.6 V/12 A, up to 220 V/0.06 A.

Finally, it is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A method for manufacturing a silicon solar cell, comprising:
    providing a carrier plate;
    applying a first contact pattern to the carrier plate, the first contact pattern comprising a set of first laminar contacts;
    applying plurality of preformed, integral, and individual silicon slices to the first contact pattern in a pick-and-place manner such that the silicon slices as preformed are picked up and placed on the first contact pattern, the silicon slices being preformed in that the silicon slices do not undergo any further processing thereof after placement on the first contact pattern, the silicon slices being integral in that each silicon slice is integrally complete prior to placement on the first contact pattern, the silicon slices being individual in that each silicon slice is not separated or cut into more than one silicon slice after placement on the first contact pattern, wherein each first laminar contact of the set of first laminar contacts is in direct physical spatial laminar contact with no more than two silicon slices; and,
    applying a second contact pattern to the plurality of silicon slices, wherein the second contact pattern comprises a set of second laminar contacts, and wherein each second laminar contact of the set of second laminar contacts is in direct physical spatial laminar contact with no more than two silicon slices.

2. The method of claim 1, wherein:
    each first laminar contact of the set of first laminar contacts is in spatial laminar contact with exactly two silicon slices, and
    each second laminar contact of the set of second laminar contacts is in spatial laminar contact with exactly two silicon slices.

3. The method of claim 1, wherein each silicon slice is in spatial laminar contact with exactly one first laminar contact and one second laminar contact.

4. The method of claim 1, further comprising one or more of passivating and anti-reflective coating one or more of the carrier plate and the silicon slices.

5. The method of claim 1, further comprising one or more of adhering the silicon slices to the first laminar contacts and adhering the silicon slices to the second laminar contacts.

6. The method of claim 5, wherein one or more of:
the adhesion of the silicon slices to the first laminar contacts is performed by applying a first contact glue to the set of first laminar contacts or the silicon slices, the first contact glue adhering the silicon slices to the first laminar contacts, and
the adhesion of the silicon slices to the second laminar contacts is performed by applying a second contact glue to the set of second laminar contacts or the silicon slices, the second contact glue adhering the silicon slices to the second laminar contacts.

7. The method of claim 5, wherein one or more of the adhesion of the silicon slices to the first laminar contacts is performed by anodic bonding techniques, and the adhesion of the silicon slices to the second laminar contacts is performed by anodic bonding techniques.

8. The method of claim 1, wherein the first or the second contact pattern is applied to the carrier plate by printing or by lithography.

9. The method of claim 8, wherein the printing is a screen printing process, or wherein the printing is performed using a hard mask.

10. The method of claim 9, wherein the printing comprises:
covering the carrier plate with a first hard mask, the first hard mask comprising a pattern of first openings, the first openings uncovering the carrier plate at areas designated for the first contact pattern;
depositing a masking material through the first hard mask on the carrier plate;
removing the first hard mask;
depositing a conductive material on the carrier plate; and,
removing the masking material from the carrier plate,
wherein the remaining conductive material constitutes the first contact pattern.

11. The method of claim 10, wherein the printing further comprises:
covering the plurality of silicon slices with a second hard mask, the second hard mask comprising a pattern of second openings, the second openings uncovering the plurality of silicon slices at areas designated for the second contact pattern;
depositing a masking material through the second hard mask on the carrier plate;
removing the second hard mask;
depositing a conductive material on the plurality of silicon slices; and,
removing the masking material from the carrier plate,
wherein the remaining conductive material constitutes the second contact pattern.

12. The method of claim 9, wherein the hard mask is provided by using soft-stamping techniques.

13. The method of claim 1, further comprising applying a filler material to the silicon slices, wherein the filler material fills the gaps between adjacent silicon slices, and wherein the filler material is electrically isolating.

* * * * *